United States Patent [19]

Hirata

[11] 4,258,314

[45] Mar. 24, 1981

[54] NONLINEAR DISTORTION MEASUREMENT USING COMPOSITE PULSE WAVEFORM

[76] Inventor: Yoshimutsu Hirata, 2568-9, Ishikawa-cho, Hachioji, Tokyo, Japan, 192

[21] Appl. No.: 34,438

[22] Filed: Apr. 30, 1979

[30] Foreign Application Priority Data

Mar. 30, 1979 [JP] Japan ................................. 54-37067

[51] Int. Cl.$^3$ .......................................... G01R 27/00
[52] U.S. Cl. .................................. 324/57 R; 328/162
[58] Field of Search ............... 324/57 R, 57 PS, 57 N; 328/148, 162

[56] References Cited

U.S. PATENT DOCUMENTS

| | | | |
|---|---|---|---|
| 3,387,211 | 6/1968 | Kaufmann et al. ............. | 324/57 R X |
| 3,421,021 | 1/1969 | Britt ................................. | 328/162 X |
| 3,469,183 | 9/1969 | Cosgrove et al. ................. | 324/57 R |

*Primary Examiner*—Stanley T. Krawczewicz

[57] ABSTRACT

The linearity of a circuit is measured by applying a test signal waveform to the circuit under test and then determining the level of the DC component or a certain low frequency component of the waveform as altered by the circuit under test. The test signal waveform has a first value for a first predetermined time period, a second value for a second predetermined time period and a third value for a third predetermined time period, the first and third values being equal in magnitude and polarity to each other, the second value being different in magnitude and polarity from the first and third values. The area of the part of the waveform above zero axis is equal to the area below the zero axis. Once the altered waveform varies in shape from the original waveform, the area of the portions of the altered waveform above and below the zero axis will be different in accordance with the nonlinearity. This difference will cause an increase in the level of the certain low frequency component which is indicative of the linearity of the circuit under test.

28 Claims, 10 Drawing Figures

NONLINEAR DISTORTION MEASUREMENT USING COMPOSITE PULSE WAVEFORM

BACKGROUND OF THE INVENTION

1. Field of the Invention

This invention relates to an improved apparatus for testing the linearity of a circuit such as audio amplifiers. The principles of this invention also have application to measurement of nonlinear distortions introduced in a signal transmission system.

2. Description of the Prior Art

In the past, to test a circuit for linearity, a sine wave test signal has been applied to a circuit under test. The output of the circuit under test, altered in accordance with the linearity of the circuit under test, is applied to a notch filter for filtering out the fundamental frequency of the input test signal. As a result, any variation in linearity of the circuit under test will cause harmonic distortion, i.e., higher harmonics in the output of the notch filter which is measured and thus provides a linearity indication.

Such an approach, generally known as the "total harmonic distortion measurement", is unsatisfactory to test linearity in circuits such as high-quality audio amplifiers in which a high degree of linearity is desired. With distortions in the input sine waveform, the harmonic distortion introduced in the circuit under test will vary accordingly causing a false linearity test. These variations in harmonic distortion appear to the test circuit as a difference in linearity, which in fact, is not the case. Furthermore, the background noise originating within the test circuit, especially filters provided at the output side thereof is superimposed upon the test signal so as to falsify the results of the measurements made. Because of these limitations, the measurement resolution in terms of the lowest measurable distortion is in the range of 0.001 to 0.01%. Another drawback of this method is its inability to provide a direct indication of the form of nonlinear distortions. In addition, this total harmonic distortion measurement is time-consuming.

It has long been recognized that the total harmonic distortion method generally does not give good correlation with subjective assessment of sound quality. In an effort to provide improved subjective agreement, R. A. Belcher proposed a new technique for measuring nonlinearity distortion, known as the double comb filter method (see "A New Distortion Measurement" by R. A. Belcher, Wireless World, May 1978, pp. 36–41). This technique uses two pseudo-random noise signals combined to provide a test signal with anharmonic components. Based on the recognition that a pseudo-random noise signal has itself a comb-like spectrum, two comb filters are employed having different comb characteristics, which are connected in cascade to reject the test signal from the output from the circuit under test. The distortion signal appearing at the output of the cascaded comb filters is measured as an indication of the linearity of the circuit. This comb filter method has proved to be effective, but suffers from the disadvantage that the circuitry required is considerably complex.

Another way to measure nonlinearity distortion is disclosed in an article entitled "Transient Nonlinear Distortion in Audio Equipment and Method of Measuring Same" by Yoshimutsu Hirata ("Japanese Acoustical Society Transaction" Vol. 1-2-16, October 1977, pp. 79–80). According to this method the test signal employed has no DC component, comprising a positive pulse and a negative pulse, in combination, the amplitudes of which are different from each other. In accordance with the teaching of that article, the test signal is generated by a clock-operated counter and a logic circuitry whose output is applied to a circuit under test after digital to analog conversion. The level of the resulting DC component or an increase of a certain low frequency component of the test signal as altered by the circuit under test indicates the linearity of the circuit. This method provides distortion figures that correlate much better than the total harmonic distortion measurement with subjective estimates of sound quality. However, it is desirable to provide a straightforward and inexpensive apparatus for testing a circuit for linearity.

OBJECTS AND SUMMARY OF THE INVENTION

It is a general object of the present invention to provide a straightforward and inexpensive apparatus for testing a circuit for linearity with a view to overcoming the deficiencies of the prior art.

It is another object of the present invention to provide an apparatus for testing the linearity of a circuit with novel means to generate a test signal waveform and a reference signal waveform.

It is a further object of the present invention to provide an apparatus for testing a circuit for linearity with electronic switch means to sample the positive cycle of the filtered test signal as altered by the circuit thereby improving measurement resolution.

It is still another object of the present invention to provide an apparatus for testing a circuit for linearity with the capability of automatically varying the amplitude of a test signal waveform to speed up a complete test.

It is still further object of the present invention to provide an apparatus for testing a circuit for linearity with means to increase the power of a test signal to thereby enable a determination of dynamic nonlinear distortion introduced in the circuit under test.

In accordance with the principles of the invention, these and other objects are accomplished by providing a test signal generator including a pair of electronic switch means. The electronic switch means are signal controlled between "ON" and "OFF" states to apply respective input DC voltages to an adder to thereby provide a test signal waveform. The resulting test signal waveform has a first value for a first predetermined time period, a second value for a second predetermined time period and a third value for a third predetermined time period. The first and third value are equal in magnitude and polarity to each other, and the second value is different in magnitude and polarity from the first and third values. The area of the part of the waveform above the zero axis is equal to the area below the zero axis. Means is provided for applying the test signal waveform to a circuit under test, the circuit under test altering the shape of the waveform in accordance with the linearity and gain of the circuit. When this occurs, the area of the portions of the altered waveform above and below the zero axis will be different in accordance with the nonlinearity. This difference will give rise to a DC component coupled with an increase of a certain low frequency component of the test signal waveform, either of which is indicative of the linearity of the circuit under test. In accordance with a preferred embodiment of this invention, there is provided means for generating and applying a reference signal waveform to the circuit under test. The difference between the levels of the certain low frequency component of the test signal waveform and the reference signal waveform as altered by the circuit under test is determined and provides by way of a divider or a pair of logarithmic amplifiers an indication of the linearity of the circuit under test.

DESCRIPTION OF THE PREFERRED EMBODIMENTS

Figure 1:
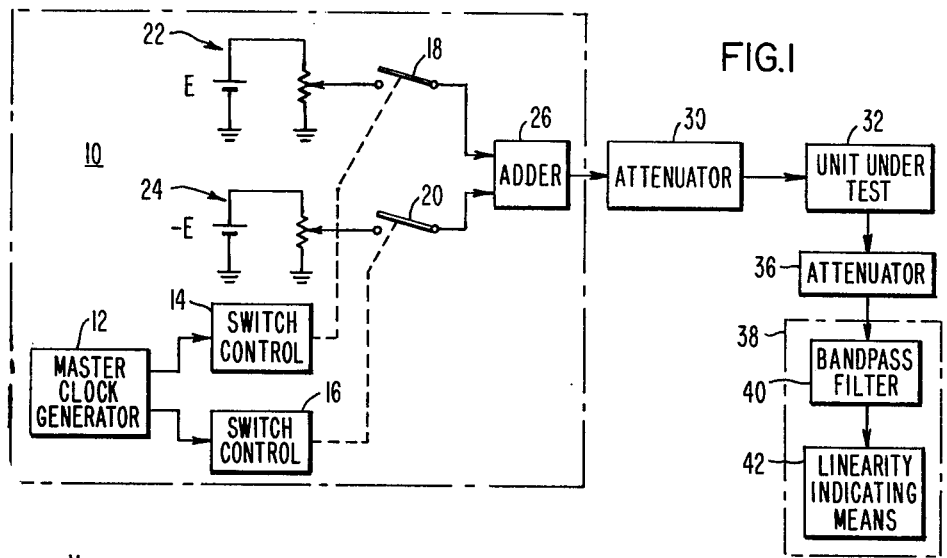
FIG. 1 is a block diagram schematically illustrating an apparatus constructed in accordance with a preferred embodiment of the present invention.

Referring to FIG. 1, there is shown a test signal generator 10 which includes a master clock generator 12, switch control circuits 14 and 16, electronic switches 18 and 20, DC voltage sources 22 and 24 and an adder circuit 26. The generator 10 provides a signal waveform 28 of FIG. 2 useful in testing the linearity of an audio amplifier, by way of example.

Signal waveform 28 is one which maintains itself at a constant level $-V_1$ for a time $T_1$, at another constant level $V_2$ for a time $T_2$ and at the same level $-V_1$ for a time $T_3$. The transitions between the two voltage levels $-V_1$ and $V_2$ take place at $t=t_1$ and $t_2$. The amplitude of the waveform 28 is zero immediately before $t=0$ and immediately after $t=t_3$. The waveform may be considered to be the sum of a step voltage $-V_1$ whose discontinuity occurs at $t=0$, a step voltage $V_1+V_2$ whose discontinuity occurs at $t=t_1$, a step voltage $-(V_1+V_2)$ whose discontinuity occurs at $t=t_2$ and a step voltage $V_1$ whose discontinuity occurs at $t=t_3$.

It is important to note that the area of the part of the waveform above the zero-voltage axis equals the area which is below the zero axis and also that $|V_1|$ is not equal to $|V_2|$. From the former requirement it will be appreciated that the DC component of the waveform 28 is always zero. It should be noted in this connection that the durations $T_1$ and $T_3$ of the negative parts of the waveform could be different provided that the "equality" requirement of the areas above and below the zero axis is satisfied. The significance of the latter requirement, i.e., $|V_1|\neq|V_2|$ is that it permits detection of typical static nonlinearities usually encountered in audio amplifiers, such as so-called S-type nonlinearity, crossover distortion and clipping. It should also be noted that an inverted waveform of the waveform 28 could equally be employed by the test apparatus constructed in accordance with the present invention. In testing audio amplifiers, the durations $T_1$, $T_3$ are preferably between 0.1 and 5 m sec. while $T_2$ is preferably between 0.05 and 0.5 m sec. The ratio $T_1/T_2$ preferably ranges from 2 to 10. In case of signal transmission systems, the duration $T_2$ is preferably selected to equal approximately the reciprocal of double the anticipated maximum frequency of the input signal.

Master clock generator 12, switch control circuits 14 and 16, electronic switches 18 and 20, DC voltage sources 22 and 24 and adder 26 are each in themselves conventional components which precisely generate waveform 28 to the above-mentioned requirements. Specifically, the DC voltage source 22 includes a positive supply E which is connected to a potentiometer to develop a constant level $V_1+V_2$. Likewise, the DC voltage source 24 includes a negative supply $-E$ which is connected to another potentiometer to develop a constant level $-V_1$. The outputs of the DC voltage sources 22 and 24 are applied to electronic switches 18 and 20, respectively, which are signal controlled between the "ON" and "OFF" states. The control signals to switches 18 and 20 are derived from switch control circuits 14 and 16, respectively. The master clock generator 12 comprises a crystal-controlled oscillator whose rectangular wave output is subjected to frequency division prior to application to switch control circuits 14 and 16.

The electronic switches 18 and 20 are connected to the adder 26 so as to supply it with the respective voltage outputs from the DC voltage sources 22 and 24. The operation of the electronic switches 18 and 20 in response to control pulses from switch control circuits 14 and 16, respectively, is indicated in lines (a), (b), (c) and (d) of FIG. 3. The duration during which electronic switch 20 remains closed is $T_1+T_2+T_3$. The outputs of the electronic switches 18 and 20 are applied to the adder 26 for synthesis to provide the output waveform 28 as shown in line (e) of FIG. 3.

Waveform 28 is applied to an input attenuator 30 of FIG. 1 which attenuates waveform 28 to a suitable level for testing a unit under test, i.e., an audio amplifier 32. Unit under test 32 amplifies the attenuated waveform 28 at the output thereof. The amplified waveform 28 is altered in accordance with the linearity and gain of the unit under test.

However, as is known, the amplifier in conventional audio equipment may have a nonlinear distortion which varies dependent on the amplitude and/or the time properties or frequency composition of the input signal. Should the circuit of the unit under test 32 have such distortion, it is possible for the waveform 28 to be altered by the circuit under test 32 as illustrated by waveform 34 of FIG. 4. The durations $T_1$, and $T_2$ and $T_3$ of the respective portions of waveform 34 will be the same regardless of the variation in shape between waveforms 28 and 34, providing that the nonlinear distortion introduced in the circuit under test is static, i.e., dependent solely on the amplitude of the signal. However, once the waveform 34 varies in shape from the waveform 28, then the areas of the portions of the waveform above and below the zero axis will be different in accordance with the nonlinearity, and this difference will give rise to a DC component coupled with an increase of low frequency components from their theoretical levels. It will be appreciated that the above-mentioned inequality of amplitude for waveform 28, that is, $|V_1|\neq|V_2|$ insures that nonlinear distortions, if any, cause a DC component as well as an increase of the low frequency components, because when $|V_1| = |V_2|$ it is possible that the positive and negative portions of the waveform 28 are identically altered. This DC component or increased level of certain low frequency components can be measured as an indication of the nonlinearity of the circuit under test 32.

To accomplish this objective, the altered waveform 34 appearing at the output of the unit under test 32 is applied to an output attenuator 36 which is a conventional circuit adapted to attenuate the amplified waveform 34 to a desired level. The output of the attenuator 36 is fed to a test signal analyzer 38 which comprises a bandpass filter 40 and linearity indicating means 42. The bandpass filter 40 removes the undesired frequencies leaving the frequency output being numerically equal to $f = 1/T_0$ (or $m/T_0$, $m = 2, 3, \ldots$). The output of the bandpass filter 40 is connected to the linearity indicating means 42 which indicates the degree of nonlinearity of the circuit under test. It is to be noted that where the DC component of the altered waveform 34 is to be measured in lieu of the low frequency component $1/T_0$ it is necessary to compensate the measurements for circuit drifts. In such a case, a smoothening circuit may be used in place of the bandpass filter 40, for the purpose of deriving the DC component of the altered waveform.

Figure 5:
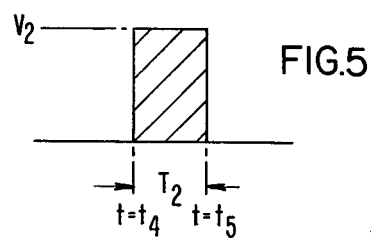

Generally, in accordance with the method of this invention, the linearity of the circuit under test is measured by separately applying the test signal waveform 28 and a reference signal waveform 44 of FIG. 5 to the circuit and thereafter determining the difference between the levels of a certain low frequency component of both waveforms as altered by the circuit. The reference signal waveform 44 is generated by operating the generator 10 of FIG. 1 in such a manner that both electronic switches 18 and 20 are closed simultaneously for a time period equal to $T_2$. The frequency spectrum (Fourier transform) of the test signal waveform 28 is represented as:

$$S_1(\omega) = (V_1 + V_2)T_2 \frac{\sin(\omega T_2/2)}{\omega T_2/2} - V_1(2T_1 + T_2) \frac{\sin \omega(2T_1 + T_2)/2}{\omega(2T_1 + T_2)/2}$$

where $T_1 = T_3$.

For $2\omega T_1, \omega T_2 < < \pi$, the $S_1(\omega)$ can be approximated by taking three terms of a Fourier series expansion, as follows:

$$S_1(\omega) \approx (\omega T_2)^2/24 \; V_2 T_2 (\gamma^2 + 3\gamma + 2)$$

where $V_1(T_1 + T_3) = V_2 T_2$; and $\gamma = V_2/V_1 = 2T_1/T_2$.

The frequency spectrum of the reference signal waveform 44 is given as:

$$S_0(\omega) = V_2 T_2 \frac{\sin(\omega T_2/2)}{\omega T_2/2}$$

For $\omega T_2 < < \pi$, the $S_0(\omega)$ can be approximated as follows:

$$S_0(\omega) \approx V_2 T_2.$$

Normalizing to make $S_0(\omega) = 1$ (0 dB) results in $$\bar{S}_1(\omega) \cong \frac{S_1(\omega)}{V_2 T_2} \cong \frac{(\omega T_2)^2}{24} (\gamma^2 + 3\gamma + 2)$$

Where it is desired to test the linearity of audio amplifiers, the angular frequency $\omega$, the width of the positive pulse $T_2$, and the ratio of the amplitude of the positive and negative pulses $V_2/V_1$ are preferably:

$\omega = 2\pi \times 250_{HZ}$ rad./sec.;
$T_2 = 1/32$ m sec.; and
$\gamma = V_2/V_1 = 3$.

In this case, the normalized frequency spectrum of the test signal waveform 28 is $$\bar{S}_1(\omega) = 0.0020 \ldots \approx 0.2\% (-54 \text{ dB})$$

It is to be understood that this value (0.2%) corresponds to a theoretical level indicative of the absence of nonlinear distortions.

Figure 6:
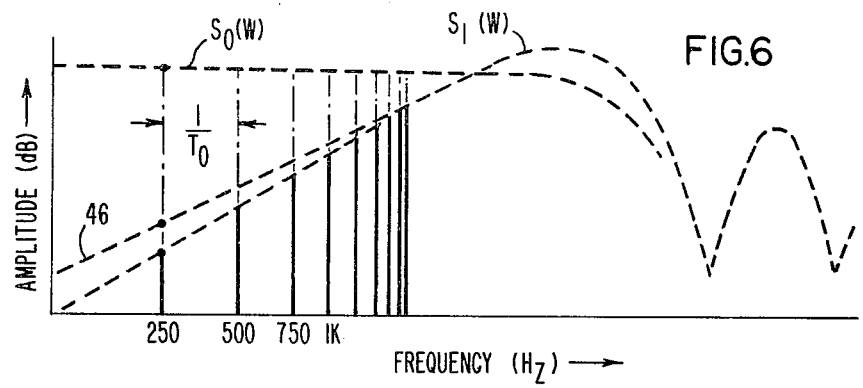
FIG. 6 is a plot of the frequency spectra of the test signal waveform before and after being altered by a circuit under test and a reference signal waveform.

A plot of the frequency spectrum $S_1(\omega)$ of the test signal waveform 28 is shown in FIG. 6. In this case, the repetition period $T_0$ of the test signal waveform 26 of FIG. 3(e) is selected to equal 4 m sec. Each frequency component is shown in thick solid line as having a separation of $1/T_0$. FIG. 6 also shows the frequency spectrum $S_0(\omega)$ of the reference signal waveform 44.

Figure 4:
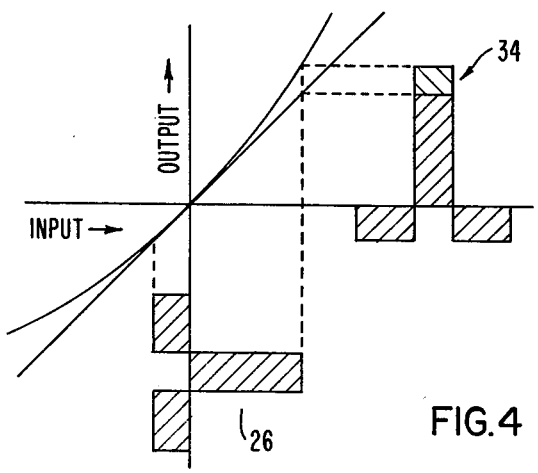

When a circuit under test alters the applied test signal waveform 28 as manifested by waveform 34 of FIG. 4, the "equality" condition for the areas above and below the zero axis no longer holds and the altered waveform shows a marked increase in the level of its low frequency components as indicated in dotted lines 46 in FIG. 6. In this embodiment, it is the $250_{HZ}$ frequency which is of interest. Bandpass filter 40 is adjusted to remove the undesired frequencies leaving that 250HZ frequency component.

In accordance with one embodiment of the method of this invention, the reference signal waveform 44 is generated by the signal generator 10 of FIG. 1 for calibration. During this time, the unit under test 32 is disconnected from the apparatus of this invention, with the output of attenuator 30 being connected directly to the input of attenuator 36. With a series of the reference signal waveform being applied, attenuator, e.g., 36 is manually adjusted until a reading of unity (100%) is indicated by the linearity indicating means 42. Then the mode of the test signal generator 10 is switched to produce a series of the test signal waveform 28, and the generator 10 is adjusted such that the linearity indicating means has a reading of 0.002 (0.2%) which is equal to the theoretical value as described above. This may be accomplished by manipulating the potentiometer of the DC voltage source 24 or the switch control circuit 14 or 16 to vary the magnitude of $-V_1$ or the length of time period $T_1$ or $T_3$, respectively. The next step is to connect a circuit such as an audio amplifier 32 between the attenuators 30 and 36, apply the reference signal waveform 44 to the circuit under test and adjust the attenuator 36 so that the linearity indicating means 42 has a reading of unity (100%). With the circuit under test 32 connected, the reading of the linearity indicating means 42 is taken by applying the test signal waveform 28 to the circuit under test. The difference between the reading of the linearity indicating means and the theoretical value gives a measure of the linearity of the circuit under test, or a distortion figure.

Tests with the circuit 32 connected to the apparatus of FIG. 1 proceed with varying amplitudes of the reference signal waveform 44 and the test signal waveform 28. Attenuator 30 is manually adjusted so as to provide for variations in the amplitude of the reference and test signal waveforms. It will be appreciated that by studying changes in the distortion figure for varying amplitudes of the reference and test signal waveforms it is possible to determine the form of nonlinear distortion, that is, whether it is S-type nonlinearity, crossover distortion or clipping.

Figure 3:
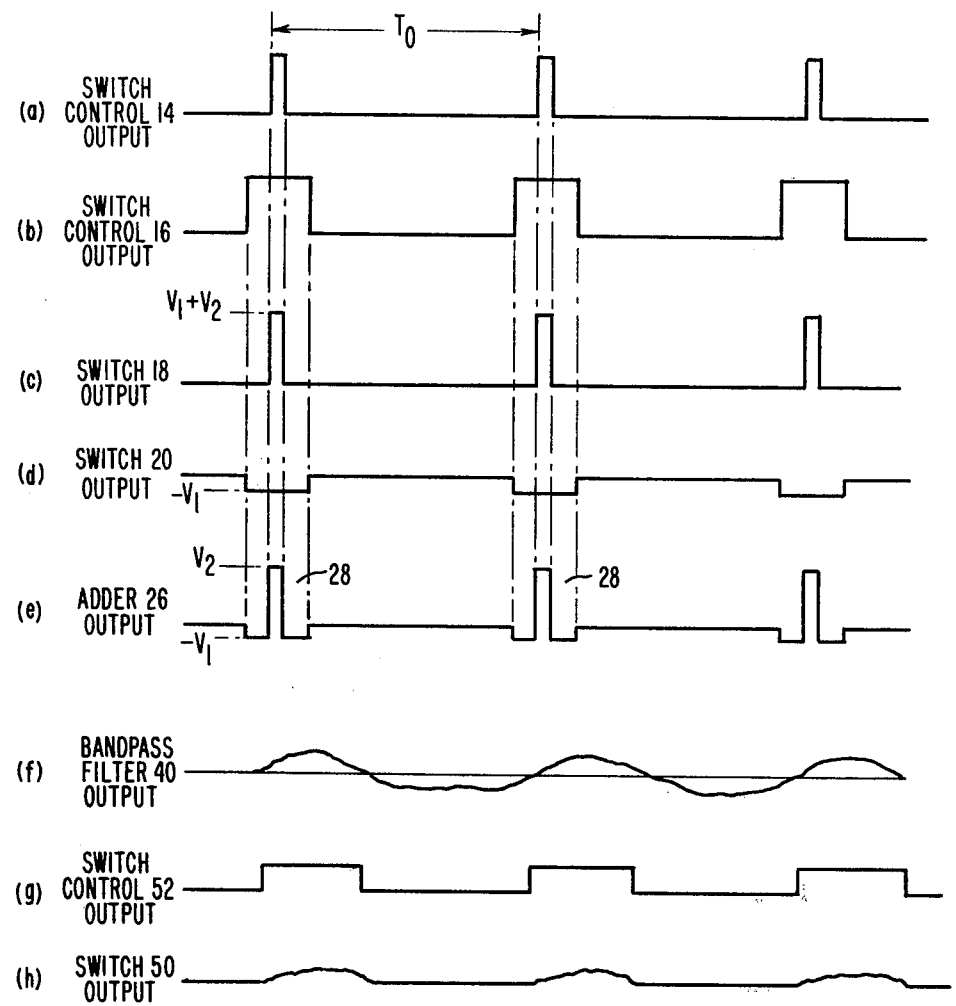
Figure 7:
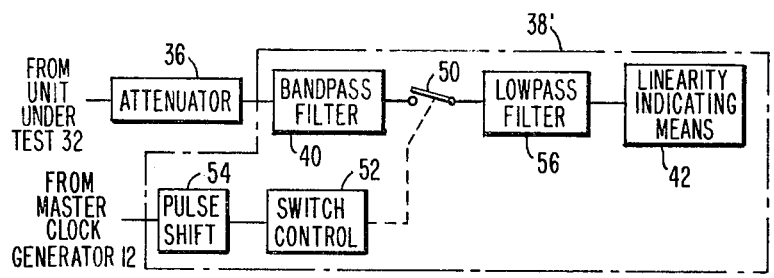
FIG. 7 is a block diagram showing a modification of the test signal analyzer employed in the system of FIG. 1.

FIG. 7 illustrates a modification of the test signal analyzer 38 shown in FIG. 1. An electronic switch 50 has been introduced to sample only the positive portion of the bandpass filter 40's output so as to provide increased measurement resolution. This will best be understood from lines (f), (g) and (h) of FIG. 3. The electronic switch 50 is supplied with a control signal as indicated in (g) of FIG. 3 from a switch control circuit 52 which is similar to circuits 14 and 16 of FIG. 1. The switch control circuit 52 in turn receives a clock signal (not shown) from the master clock generator 12 through a pulse shift circuit 54, the clock signal having been delayed a suitable amount by the phase shifter 54 so that the time during which the switch control 52's output is at a higher level coincides with the positive half cycle of the bandpass filter output. The pulse shifter 54 is manually adjusted so as to maximize the output of the electronic switch 50. The resultant electronic switch output as indicated in line (h) of FIG. 3 is lowpass filtered by a filter 56 to produce an output signal which is applied to the linearity indicating means 42.

Figure 8:
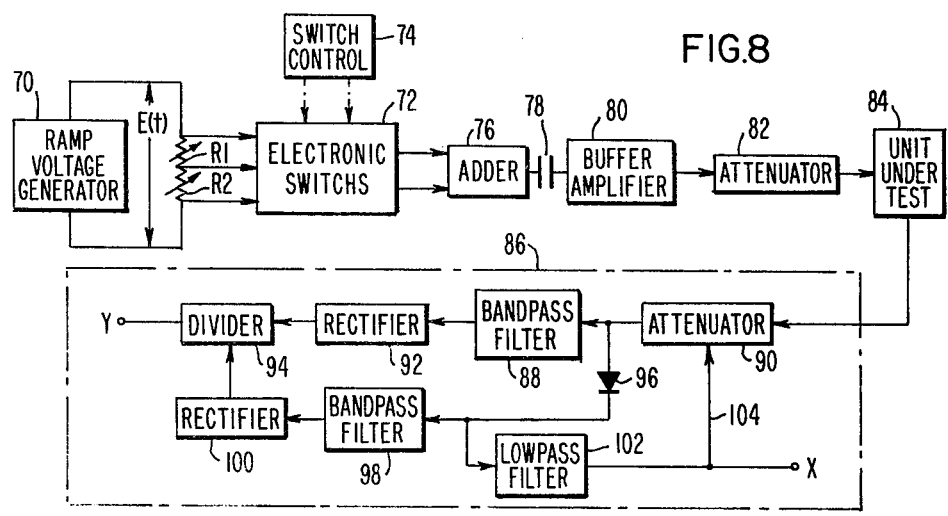
FIG. 8 is a block diagram of a further embodiment of the present invention.

FIG. 8 shows a block diagram of an apparatus for testing a circuit for linearity in accordance with a further embodiment of the present invention. This embodiment differs from that of FIG. 1 in providing the capability of automating a series of distortion measurements to minimize the measurement time. A ramp voltage generator 70 is employed which generates at its output a ramp voltage E(t). The rate at which the ramp voltage E(t) varies is, for example, 5 volts per sec. The ramp voltage output is applied across a potentiometer which consists of variable resistors $R_1$ and $R_2$. The values of the variable resistors $R_1$ and $R_2$ are adjusted such that assuming the voltage at a connection between $R_1$ and $R_2$ to be zero the ratio of the voltages across $R_1$ and $R_2$ is $V_2 - V_1$. The voltages across $R_1$ and $R_2$ are applied to respective electronic switches 72, similar to those 18 and 20 of FIG. 1, which are signal controlled by a switch control circuit 74. The operation of the electronic switches 72 is identical to that of the electronic switches 18 and 20 and the resultant switched signals from the electronic switches 72 are supplied to an adder 76. The output of the adder 76 is high-pass filtered or passed through a capacitor 78 for DC cut-off and then is supplied to a buffer amplifier 80. The output of the buffer amplifier 80 is applied through an attenuator 82 to a circuit under test 84.

The altered output from the circuit under test, that is, the voltage across its 8 ohm resistance load or loudspeaker load, is supplied to a test signal analyzer 86 which is somewhat different from that of FIG. 1. As seen, a bandpass filter 88 is connected to the output of an attenuator 90 to pass only the frequency component $1/T_0$ or $m/T_0$ (m 2,3,4 ...) of the attenuated altered test signal waveform. The resultant filtered signal from the lowpass filter 88 is supplied to a rectifier 92 and then is applied to one input of a divider circuit 94.

The output from the attenuator 90 is also applied to a half-wave rectifier 96 to sample the positive portion of each altered test signal waveform to produce an output signal corresponding to the altered reference signal waveform. The resultant half-wave rectified signal from the rectifier 96 is passed through a bandpass filter 98 having identical characteristics to the filter 88 to single out the desired low frequency component. The output from the bandpass filter 98 is applied to the other input of the divider 94 after rectification by a rectifier 100. The output from the divider 94 is representative of the ratio of the level of the certain low frequency component of the test signal waveform to that of the reference signal waveform as altered by the circuit under test. A lowpass filter 102 is connected to the output of the half-wave rectifier 96 to provide an output signal corresponding to the level of the certain low frequency of the positive portion of the altered test signal waveform. The output signal of the lowpass filter 102 is applied to the attenuator 90 through line 104 to vary the amount of attenuation provided thereby to a suitable level. The output of the divider 94 and that of the lowpass filter 102 are applied to the Y-axis and X-axis terminals respectively of an X−Y recorder (not shown) to form a display of the amount of nonlinear distortion, i.e., the distortion figure, varying with the amplitude of the input test signal waveform.

It will be appreciated that if the unit under test is linear the output of the divider 94 remains constant irrespective of changes in the amplitude of the input test signal waveform. When the divider output varies otherwise, it is possible to determine the form of nonlinear distortion based on the curve of the divider output. It will be also appreciated that a pair of logarithmic amplifiers could be employed in place of the divider 94 to provide an indication (in dB) of the linearity of the circuit under test.

Figure 2:
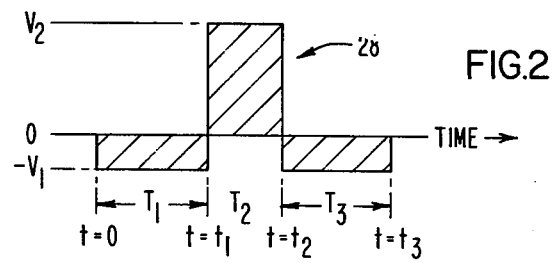
FIGS. 2, 3, 4 and 5 are graphs of various waveforms useful in illustrating the principles of the present invention.
Figure 9:
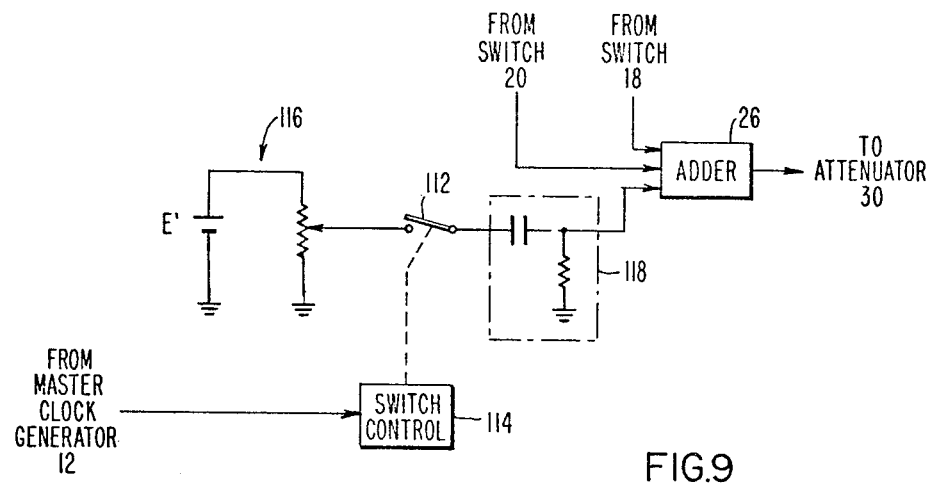
FIG. 9 is a block diagram showing an arrangement for increasing the power of the test signal waveform to be applied to the circuit under test.
Figure 10:
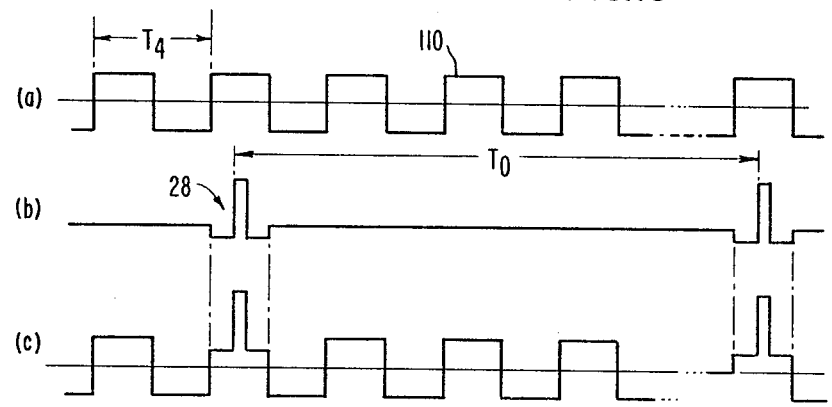
FIG. 10 is a graph of various waveforms useful in illustrating the operation of the arrangement shown in FIG. 9.

FIG. 9 illustrates an arrangement for superimposing a rectangular pulse waveform on the test signal waveform 28 of FIG. 2 to permit testing of the circuit under test 32 under increased drive conditions. The rectangular pulse waveform 110 is indicated in line (a) of FIG. 10 and is generated by an electronic switch 112 operative in response to a control signal from a switch control circuit 114. The switch control circuit 114 is similar to those indicated at 14 and 16 of FIG. 1 and responds to the clock signal from the master clock generator 12 by generating the control signal. The electronic switch 112 has an input connected to a DC voltage source 116 and an output connected to a highpass filter 118 consisting of a capacitor and a grounded resistor. The output of the highpass filter 118 is applied to the adder 26 of FIG. 1 together with the outputs from the electronic switches 18 and 20 to provide a composite signal waveform as indicated in line (c) of FIG. 10. The switch control 114 is adjusted such that each test signal waveform 28 coincides with the positive or negative cycle of the rectangular signal waveform 110. Also, it is important to select the repetition periods $T_3$ and $T_0$ of the rectangular signal waveform and the test signal waveform respectively such that $1/T_0 << 1/T_3$ to thereby isolate the particular low frequency component of the test signal waveform whose level is to be measured, from the frequency components of the rectangular signal waveform. With this arrangement, it is possible to increase the power of the input signal supplied to the circuit under test 32 to permit a determination of the presence or absence of dynamic nonlinear distortion which is introduced in the circuit dependent not only on the amplitude but also on the time properties or frequency composition of the signal. Let it be assumed that a rectangular signal waveform having an amplitude equal to half the peak value $V_2$ of the test signal waveform 28 is superimposed on the test signal waveform with $T_2$ equal to 1/32 m sec. and the repetition period $T_0$ equal to 4 m sec. In such a case, the power of the composite test signal is increased by a factor of approximately $3 \times 10^4$.

It will be understood and appreciated that many changes can be made in the preferred embodiments described herein and that, further, alternate means of implementation thereof are possible and within the skill of those familiar with the art. Consequently, while the present invention has been described by way of specific examples, it is not to be solely limited thereto, except as defined by the appended claims.

I claim:

1. An apparatus for measuring the linearity of a circuit, comprising:
    means for generating a test signal waveform having a first value for a first predetermined time period, a second value for a second predetermined time period immediately following said first predetermined time period and a third value for a third predetermined time period immediately following said second predetermined time period, said first and third values being equal in magnitude and polarity to each other, said second value being different in magnitude and polarity from said first and third values, the area of the part of said test signal waveform above the zero axis being equal to the area below the zero axis;
    means for applying said test signal waveform to said circuit, said circuit tending to alter the applied waveform in accordance with the linearity and gain of said circuit to produce as an output signal an altered test signal waveform; and
    means for determining the level of a predetermined low frequency component of said altered test signal waveform and for comparing the determined level to its theoretical level to produce an output signal indicative of the linearity of said circuit, said theoretical level being equal to the level of said predetermined low frequency component of said unaltered test signal waveform multiplied by the gain of said circuit.

2. The apparatus of claim 1 wherein said means for generating a test signal waveform comprises means providing a first DC voltage of said first value, means providing a second DC voltage of said second value minus said first value, adder means having at least a first and a second input, first switch means operative in response to a first control signal to couple said first DC voltage to said first input of said adder, second switch means operative in response to a second control signal to couple said second DC voltage to said second input of said adder, means for providing said first control signal to said first switch means during said first, second and third predetermined time periods, and means for providing said second control signal to said second switch means during said second predetermined time period.

3. The apparatus of claim 1 further comprising means for varying the amplitude of said test signal waveform before being applied to said circuit.

4. The apparatus of claim 1 wherein said means for determining the level of a predetermined low frequency component comprises a first bandpass filter connected to receive said altered test signal waveform and to pass therethrough only the predetermined low frequency component thereof, and linearity indicating means responsive to the output of said bandpass filter for providing a signal indicating the level of said predetermined low frequency component of said altered test signal waveform.

5. The apparatus of claim 1 wherein said means for determining the level of a predetermined low frequency component comprises a first bandpass filter connected to receive said altered test signal waveform and to pass therethrough only the predetermined low frequency component thereof, third switch means operative in response to a third control signal to couple the output of said first bandpass filter to a lowpass filter, linearity indicating means responsive to the output of said lowpass filter for providing a signal indicating the level of said predetermined low frequency component of said altered test signal waveform, and means for providing said third control signal to said third switch means during the positive cycle of the output of said bandpass filter.

6. The apparatus of claim 2 further comprising means providing a third DC voltage of a fourth value, fourth switch means operative in response to a fourth control signal to couple said third DC voltage to a third input of said adder means, DC cutoff means connected between said fourth switch means and the third input of said adder means, means for providing said fourth control signal to said fourth switch means at a predetermined repetition frequency to produce a rectangular waveform at the output of said DC cutoff means, said predetermined repetition frequency of said rectangular waveform being substantially higher than the repetition frequency of said test signal waveform, the relative phase of said rectangular waveform and said test signal waveform being such that each test signal waveform coincides with one of the positive and negative cycles of said rectangular waveform.

7. The apparatus of claim 1 wherein said circuit forms part of audio equipment such as an audio amplifier and wherein said first and third predetermined time periods are in the range of 0.1 to 5 m sec. and said second predetermined time period is in the range of 0.05 to 0.5 m sec., the ratio of said first predetermined time period to said second predetermined time period being in the range of 2 to 10.

8. The apparatus of claim 1 wherein said circuit forms part of a signal transmission system and wherein said second predetermined time period is approximately equal to the reciprocal of double the anticipated maximum frequency of an input signal to said signal transmission system.

9. The apparatus of claim 1 wherein said means for generating a test signal waveform comprises means providing a first DC voltage of said first value, means providing a second DC voltage of said second value minus said first value, adder means having at least a first and a second input, first switch means operative in response to a first control signal to couple said first DC voltage to said first input of said adder, second switch means operative in response to a second control signal to couple said second DC voltage to said second input of said adder, means for providing said first control signal to said first switch means during said first, second and third predetermined time periods, and means for providing said second control signal to said second switch means during said second predetermined time period.

10. The apparatus of claim 1 further comprising means providing a third DC voltage of a fourth value, fourth switch means operative in response to a fourth control signal to couple said third DC voltage to a third input of said adder means, DC cutoff means connected between said fourth switch means and the third input of said adder means, means for providing said fourth control signal to said fourth switch means at a predetermined repetition frequency to produce a rectangular waveform at the output of said DC cutoff means, said predetermined repetition frequency of said rectangular waveform being substantially higher than the repetition frequency of said test signal waveform, the relative phase of said rectangular waveform and said test signal waveform being such that each test signal waveform coincides with one of the positive and negative cycles of said rectangular waveform.

11. The apparatus of claim 1 wherein said means for generating a test signal waveform comprises means providing a first DC voltage of said first value, means providing a second DC voltage of said second value minus said first value, adder means having at least a first and a second input, first switch means operative in response to a first control signal to couple said first DC voltage to said first input of said adder, second switch means operative in response to a second control signal to couple said second DC voltage to said second input of said adder, means for providing said first control signal to said first switch means during said first, second and third predetermined time periods, and means for providing said second control signal to said second switch means during said second predetermined time period, and wherein said means for generating a reference signal waveform comprises means for providing said first and second control signals during said fourth predetermined time period.

12. The apparatus of claim 11 further comprising means providing a third DC voltage of a fifth value, fourth switch means operative in response to a fourth control signal to couple said third DC voltage to a third input of said adder means, DC cutoff means connected between said fourth switch means and the third input of said adder means, means for providing said fourth control signal to said fourth switch means at a predetermined repetition frequency to produce a rectangular waveform at the output of said DC cutoff means, said predetermined repetition frequency of said rectangular waveform being substantially higher than the repetition frequency of said test signal waveform, the relative phase of said rectangular waveform and said test signal waveform being such that each test signal waveform coincides with one of the positive and negative cycles of said rectangular waveform.

13. The apparatus of claim 1 wherein said means for generating a test signal waveform comprises means providing a first DC voltage of said first value, means providing a second DC voltage of said value minus said first value, adder means having at least a first and a second input, first switch means operative in response to a first control signal to couple said first DC voltage to said first input of said adder, second switch means operative in response to a second control signal to couple said second DC voltage to said second input of said adder, means for providing said first control signal to to said first switch means during said first, second and third predetermined time periods, and means for providing said second control signal to said second switch means during said second predetermined time period, and wherein said means for generating a reference signal waveform comprises means for providing said first and second control signals during said fourth predetermined time period.

14. The apparatus of claim 1 further comprising means providing a third DC voltage of a fifth value, fourth switch means operative in response to a fourth control signal to couple said third DC voltage to a third input of said adder means, DC cutoff means connected between said fourth switch means and the third input of said adder means, means for providing said fourth control signal to said fourth switch means at a predetermined repetition frequency to produce a rectangular waveform at the output of said DC cutoff means, said predetermined repetition frequency of said rectangular waveform being substantially higher than the repetition frequency of said test signal waveform, the relative phase of said rectangular waveform and said test signal waveform being such that each test signal waveform coincides with one of the positive and negative cycles of said rectangular waveform.

15. An apparatus for measuring the linearity of a circuit, comprising:
    means for generating a test signal waveform having a first value for a first predetermined time period, a second value for a second predetermined time period immediately following said first predetermined time period and a third value for a third predetermined time period immediately following said second predetermined time period, said first and third values being equal in magnitude and polarity to each other, said second value being different in magnitude and polarity from said first and third values, the area of the part of said test signal waveform above the zero axis being equal to the area below the zero axis;
    means for applying said test signal waveform to said circuit, said circuit tending to alter the applied waveform in accordance with the linearity and gain of said circuit to produce as an output signal an altered test signal waveform; and
    means for determining the level of a DC component of said altered test signal waveform to produce an output signal indicative of the linearity of said circuit.

16. An apparatus for measuring the linearity of a circuit, comprising:
    means for generating a test signal waveform having a first value for a first predetermined time period, a second value for a second predetermined time period immediately following said first predetermined time period and a third value for a third predetermined time period immediately following said second predetermined time period, said first and third values being equal in magnitude and polarity to each other, said second value being different in magnitude and polarity from said first and third values, the area of the part of said test signal waveform above the zero axis being equal to the area below the zero axis;
    means for applying said test signal waveform to said circuit, said circuit tending to alter the applied waveform in accordance with the linearity and gain of said circuit to produce as an output signal an altered test signal waveform;

means for generating a reference signal waveform having a fourth value for a fourth predetermined time period, said fourth value being equal in magnitude and polarity to said second value, said fourth predetermined time period being equal to said second predetermined time period;

means for applying said reference signal waveform to said circuit, said circuit tending to alter the applied reference signal waveform in accordance with the linearity of and gain of said circuit to produce as an output signal an altered reference signal waveform; and means for determining the respective levels of a predetermined low frequency component of said altered test signal waveform and of said altered reference signal waveform and for comparing the determined levels to each other to produce an output signal indicative of the linearity of said circuit.

17. The apparatus of claim 12 further comprising means for varying the amplitude of said test signal waveform and said reference signal waveform before being applied to said circuit.

18. The apparatus of claim 16 wherein said means for determining the respective levels of a predetermined low frequency component comprises a first bandpass filter connected to receive said altered test signal waveform and said reference signal waveform and to pass therethrough only the predetermined low frequency component thereof, and linearity indicating means responsive to the output of said bandpass filter for providing signals indicating the respective levels of said predetermined low frequency component of said altered test signal waveform and of said altered reference signal waveform.

19. The apparatus of claim 16 wherein said means for determining the respective levels of a predetermined low frequency component comprises a first bandpass filter connected to receive said altered test signal waveform and said reference signal waveform and to pass therethrough only the predetermined low frequency component thereof, third switch means operative in response to a third control signal to couple the output of said first bandpass filter to a lowpass filter, linearity indicating means responsive to the output of said lowpass filter for providing signals indicating the respective levels of said predetermined low frequency component of said altered test signal waveform and of said reference signal waveform, and means for providing said third control signal to said third switch means during the positive cycle of the output of said bandpass filter.

20. The apparatus of claim 16 wherein said circuit forms part of audio equipment such as an audio amplifier and wherein said first and third predetermined time periods are in the range of 0.1 to 5 m sec. and said second predetermined time period is in the range of 0.05 to 0.5 m sec., the ratio of said first predetermined time period to said second predetermined time period being in the range of 2 to 10.

21. The apparatus of claim 16 wherein said circuit forms part of a signal transmission system and wherein said second predetermined time period is approximately equal to the reciprocal of double the anticipated maximum frequency of an input signal to said signal transmission system.

22. An apparatus for measuring the linearity of a circuit, comprising:

means for generating a test signal waveform having a first value for a first predetermined time period, a second value for a second predetermined time period immediately following said first predetermined time period and a third value for a third predetermined time period immediately following said second predetermined time period, said first and third values being equal in magnitude and polarity to each other, said second value being different in magnitude and polarity from said first and third values, the area of the part of said test signal waveform above the zero axis being equal to the area below the zero axis;

means for applying said test signal waveform to said circuit, said circuit tending to alter the applied waveform in accordance with the linearity and gain of said circuit to produce as an output signal an altered test signal waveform;

means for generating a reference signal waveform having a fourth value for a fourth predetermined time period, said fourth value being equal in magnitude and polarity to said second value, said fourth predetermined time period being equal to said second predetermined time period;

means for applying said reference signal waveform to said circuit, said circuit tending to alter the applied reference signal waveform in accordance with the linearity of and gain of said circuit to produce as an output signal an altered reference signal waveform; and means for determining the respective levels of a DC component of said altered test signal waveform and of said altered reference signal waveform and for comparing the determined levels to each other to produce an output signal indicative of the linearity of said circuit.

23. An apparatus for measuring the linearity of a circuit, comprising:

means for generating a test signal waveform having a first value for a first predetermined time period, a second value for a second predetermined time period immediately following said first predetermined time period and a third value for a third predetermined time period immediately following said second predetermined time period, said first and third values being equal in magnitude and polarity to each other, said second value being different in magnitude and polarity from said first and third values, the area of the part of said test signal waveform above the zero axis being equal to the area below the zero axis;

means for applying said test signal waveform to said circuit, said circuit tending to alter the applied waveform in accordance with the linearity and gain of said circuit to produce as an output signal an altered test signal waveform;

a first bandpass filter connected to receive said altered test signal waveform and to pass therethrough only the predetermined low frequency component thereof;

a first rectifier connected to receive the output of said first bandpass filter;

a half-wave rectifier connected to receive said altered test signal waveform;

a second bandpass filter connected to receive the output of said half-wave rectifier and having identical characteristic to said first bandpass filter;

a second rectifier connected to receive the output of said second bandpass filter; and means connected to said first and second rectifiers to determine the ratio of the output of said first rectifier to that of said second rectifier.

24. The apparatus of claim 23 wherein said means for generating a test signal waveform includes a ramp voltage generator having a potentiometer connected thereacross, said potentiometer comprising a first and a second variable resistors.

25. The apparatus of claim 23 wherein said means connected to said first and second rectifiers includes a pair of logarithmic amplifiers.

26. The apparatus of claim 23 further comprising a lowpass filter connected to receive the output of said half-wave rectifier, and an X-Y recorder having an X-axis terminal connected to the output of said lowpass filter and a Y-axis terminal connected to said last-named means connected to said first and second rectifiers.

27. The apparatus of claim 23 wherein said circuit forms part of audio equipment such as an audio amplifier and wherein said first and third predetermined time periods are in the range of 0.1 to 5 m sec. and said second predetermined time period is in the range of 0.05 to 0.5 m sec., the ratio of said first predetermined time period to said second predetermined time period being in the range of 2 to 10.

28. The apparatus of claim 23 wherein said circuit forms part of a signal transmission system and wherein said second predetermined time period is approximately equal to the reciprocal of double the anticipated maximum frequency of an input signal to said signal transmission system.

* * * * *